United States Patent [19]

Inoue

[11] Patent Number: 4,902,582
[45] Date of Patent: Feb. 20, 1990

[54] ALUMINUM METALLIZED LAYER FORMED ON SILICON WAFER

[75] Inventor: Minoru Inoue, Kawasaki, Japan

[73] Assignee: Fujitsu Limited, Kawasaki, Japan

[21] Appl. No.: 300,186

[22] Filed: Jan. 23, 1989

Related U.S. Application Data

[63] Continuation of Ser. No. 24,071, Mar. 10, 1987, abandoned, which is a continuation-in-part of Ser. No. 786,239, Oct. 10, 1985, abandoned.

[30] Foreign Application Priority Data

Oct. 18, 1984 [JP] Japan .................................. 59-217398

[51] Int. Cl.$^4$ ............................................. B32B 15/04
[52] U.S. Cl. ...................................... 428/641; 428/650
[58] Field of Search ......................... 428/620, 641, 650

[56] References Cited

U.S. PATENT DOCUMENTS 4,527,184  7/1985  Fischer .................................. 357/67

FOREIGN PATENT DOCUMENTS 2128636  5/1984  United Kingdom ................ 428/650

Primary Examiner—Robert McDowell
Attorney, Agent, or Firm—Staas & Halsey

[57] ABSTRACT

A semiconductor device comprising a metallized layer formed on a silicon substrate, wherein said metallized layer is an aluminum alloy consisting essentially of aluminum, silicon and at least one element selected from the group consisting of titanium, vanadium, chromium, tungsten, and phosphorus the amount of silicon being 1.0% to 3.0% by weight, the amount of said selected element corresponding to the relative service life required of the metallized layer, said required service life being 10 times that of a metallized layer having the same composition as that of the above-mentioned metallized layer except for being free from said element, and the rest being aluminum. For example, the metallized layer may contain at least 0.04% and less than 0.10% by weight of titanium, 1.0% by weight of silicon, and the rest aluminum.

9 Claims, 3 Drawing Sheets

CONTENT OF SELECTED ELEMENT
IN Al−1% Si ALLOY

CONTENT OF SELECTED ELEMENT
IN Al-1% Si ALLOY

4,902,582

ALUMINUM METALLIZED LAYER FORMED ON SILICON WAFER

CROSS REFERENCE

This is a continuation of co-pending application Ser. No. 024,071, filed on Mar. 10, 1987, abandoned, which is a continuation-in-part application of U.S. Ser. No. 786,239 filed Oct. 10, 1985 abandoned.

BACKGROUND OF THE INVENTION

1. Field of the Invention

The present invention relates to a semiconductor device comprising a metallized aluminum alloy layer, which eliminates disadvantages inherent to conventional metallized aluminum layers formed on a silicon substrate.

2. Description of the Related Art

In the process of producing an aluminum layer metallized on a silicon substrate, first, windows are opened through an insulating layer formed on P-N junction areas of the silicon substrate, then, aluminum is metallized thereon by a sputtering process and is patterned by dry etching. In addition, a passivation layer is formed on the patterned aluminum layer by chemical vapor deposition of phosphosilicate glass (PSG).

When the silicon substrate is subjected to a thermal treatment of 400° C. to 500° C. in the processing, such as the formation of a passivation layer, a certain amount of silicon and aluminum dissolves into each other.

The bulky insulating layer forms an edge at the periphery of the window. Consequently, structural strain occurs in the portion of silicon underlying the edge of the insulating layer. The aluminum invades the diffused areas of silicon, particularly at the portion having structural strain, to form so called spikes, which lead to breakage of the p-N junction in the diffused areas. In order to prevent such defects, it has been known to add 1.0% to 2.0% by weight of silicon in the aluminum of the metallized layer.

If an amount of more than 2.0% by weight of silicon is added to the aluminum, the oversaturated silicon precipitates, after cooling. These precipitates form a layer of silicon containing aluminum atoms on the N-type contact area of the silicon substrate. The precipitates act as a P-type conductor, and thus, a parasitic P-N junction is formed at the boundary of the metallized layer of aluminum and the diffused areas of silicon to increase the contact resistance, and relatively large silicon particles are formed within the aluminum layer, remaining even after the dry etching when patterning the aluminum.

The formation of "hillocks" will be explained in detail. When a highly densified electric current is conducted through a metallized aluminum alloy layer at a high temperature hillocks are apt to grow and cause a deterioration in the conductivity of the metallized layer.

The term "electromigration" describes the diffusion of metallic atoms caused by a mutual reaction between the metallic atoms and the densified electron flux which flow through the lattice of the metallic atoms. When an electric current flows, for example, with a current density of more than 5 amperes/cm$^2$ at a temperature in the range of 150° to 200° C. through a metallized aluminum layer 1.0 $\mu$m in depth and 1.2 to 2.0 $\mu$m in width, the aluminum atoms gather kinetic energy from the flowing electrons, and dislocate along the direction of the flow of the electrons. Thus, voids are formed in the location lacking the aluminum atoms, and the voids reduce the effective sectional area of the metallized layer and further increase the current density. The area around the voids is locally heated by the joule effect, and the formation of voids is accelerated, which leads to breakages in the metallized layer.

On the other hand, the area into which the aluminum atoms moved becomes rich in aluminum atoms, which leads to a growth of hillocks. The hillocks extrude through the interlayer insulating layer formed on the metallized layer, and lead to breakage of the insulation between the metallized aluminum layer and the upper aluminum layer formed on the interlayer insulating layer.

In addition, hillocks of aluminum extrude into and through a passivation layer formed on the metallized layer, during repeated thermal processing, reducing the moisture resistance of the passivation layer and shortening the service life of the aluminum layer.

Thus, the reliability of a bipolar device, which operates by means of the electric signals, depends on the behaviour of the electromigration. The increasing integration of the semiconductor device means that the size of the metallized layers must be decreased. Therefore, there is a demand for a metallized layer having an excellent resistance against electromigration, which ensures the service life of a metallized layer referred to in this specification.

It has been also known to use metals other than aluminum, in the form of silicide, such as tungsten silicide, as a conductor on a silicon substrate. However, these silicides have the disadvantages of a high electric resistance and difficulties in aluminum wire bonding.

SUMMARY OF THE INVENTION

It is an object of the present invention to prevent deterioration of the moisture resistance of a passivation layer due to the extrusion of hillocks of aluminum therethrough, and to increase the service life of a metallized layer to correspond to the electromigration resistance.

It is another object of the present invention to prevent destruction of the underlying diffused areas of silicon due to the formation of spikes of aluminum therein.

It is yet another object of the present invention to prevent an increase of the contact resistance due to the formation of a parasitic P-N junction.

It is still another object of the present invention to eliminate precipitated silicon particles during the dry etching of the aluminum.

There is provided a semiconductor device comprising a metallized layer formed on a silicon substrate, wherein said metallized layer is an aluminum alloy consisting essentially of aluminum, silicon and at least one element selected from the group consisting of titanium, vanadium, chromium, tungsten and phosphorus, the amount of silicon being 1.0% to 3.0% by weight, the amount of said selected element corresponding to the relative service life required of the metallized layer, said required service life being 10 times that of a metallized layer having the same composition as that of the above-mentioned metallized layer except for being free from said element.

The service life of a metallized layer formed on a silicon substrate corresponds to the resistance thereof against electromigration of aluminum atoms through the lattice, the grain boundary or the surface. In the previous art where the width of a metallized aluminum layer is 5 to 10 μm, which is evidently larger than the grain size of aluminum, which is usually about 2 μm, aluminum atoms diffuse dominantly through the grain boundary.

However, in recent microstructured patterns of the aluminum layer, the diffusion of aluminum atoms through the lattice and the surface has become too large and cannot be neglected.

On the other hand, certain elements referred to as selected elements in this specification, i.e., titanium, vanadium, chromium, tungsten, and phosphorus, are scarcely dissolved in aluminum at a high temperature e.g., 500° C.

| Solubility of the Selected Elements in Aluminum at 500° C. | |
|---|---|
| Titanium | 0.08 (wt %) |
| Vanadium | 0.15 |
| Chromium | 0.2 |
| Tungsten | 0.2 |
| Phosphorus | 0.08 |

Therefore, these elements tend to precipitate not only at the grain boundary, but also within the aluminum grains, after the silicon substrate was subjected to thermal processing such as chemical vapour deposition. It is considered that these precipitates formed within the aluminum grains control the diffusion of aluminum atoms due to the electromigration thereof, and thus breakage of the aluminum pattern is retarded, so that the service life of a metallized layer is increased to about 10 times that of a metallized layer which has the same composition except for being free from these selected atoms.

Such elongation of the service life may be obtained by including each of the selected elements in an amount set forth below.

An amount of titanium of at least 0.04% and less than 0.10% by weight.

An amount of vanadium of at least 0.06% and less than 0.15% by weight.

An amount of chromium of at least 0.09% and less than 0.2% by weight.

An amount of tungsten of at least 0.1% and less than 0.3% by weight.

An amount of phosphorus of at least 0.05% and less than 0.12% by weight.

The sputtering temperature can be raised to 300° C. without the extrusion of aluminum hillocks, contrary to the conventional sputtering temperature of 250° C., to obtain a better step coverage of the metallized aluminum layer.

It is, of course, possible to prevent an invasion of aluminum spikes through the diffused areas of the silicon substrate, when titanium, vanadium, chromium, tungsten, and phosphorus coexist with silicon in the metallized aluminum. Each of these coexisting selected elements reacts with silicon to form a silicide, such as $TiSi_2$. Thus, it is possible to increase the amount of silicon by up to 3.0% by weight in the aluminum without increasing the number of silicon precipitates in the grain boundary of the aluminum. If a metallized aluminum alloy contains less than 1.0% by weight of silicon, silicon diffuses from the substrate into the metallized layer during thermal processing.

DESCRIPTION OF THE PREFERRED EMBODIMENT

The advantages of the present invention will be clearly understood by the following example, which illustrates an embodiment of the present invention, but does not limit the scope thereof.

EXAMPLE

Figure 1:
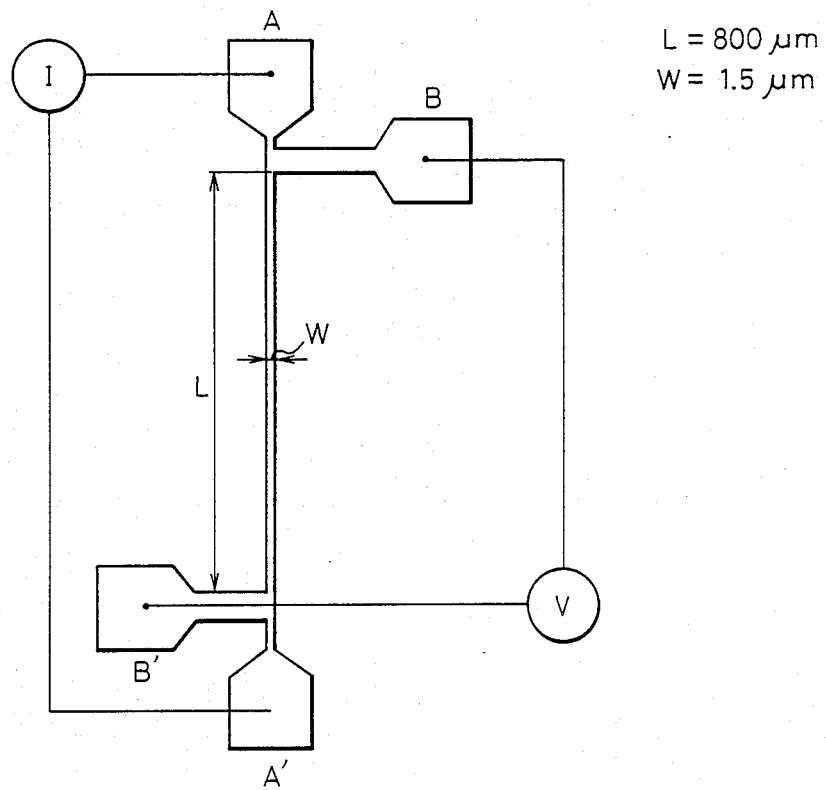
FIG. 1 is a plan view of a test pattern of a metallized layer.

An aluminum alloy was metallized on a silicon substrate by a sputtering process, in which the target was an alloy containing a certain amount of one of the selected elements, 1% by weight of silicon, and the rest aluminum, the silicon substrate was preheated at about 300° C., the distance of the substrate from the target was 5 to 10 cm, the pressure of argon was kept at 2 to 10 mili Torr, and about 7 kW of power was applied. The temperature of the silicon substrate was kept at about 200° C. An aluminum alloy layer about 1 μm in thickness was metallized on a thermally oxidized silicon layer. Then, a test chip 1.5 μm in width and 800 μm in length for measurement, as shown in FIG. 1, was produced from the metallized aluminum alloy by conventional dry etching.

Figure 2:
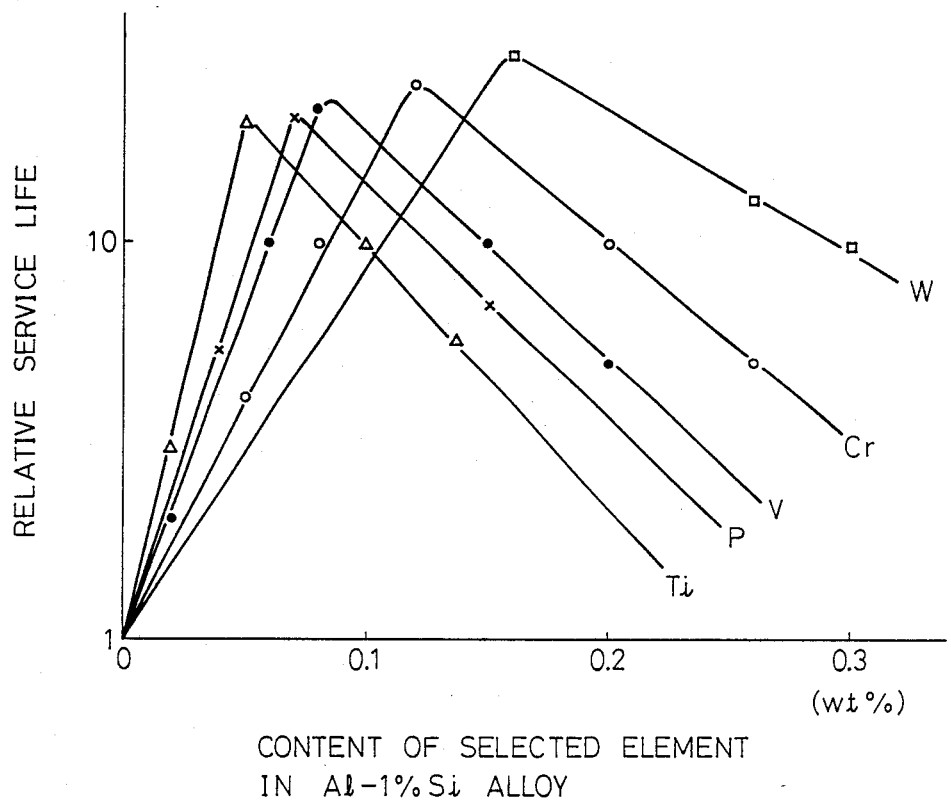
FIG. 2 is a diagram showing the relationship between the relative service life of a metallized layer and the content of a selected element.

The test chip was kept at about 250° C., and an electric current of $1 \times 10^6$ A/cm$^2$ was conducted between electrodes A-A', and the voltage was measured between electrodes B-B'. After a long time had passed, the diffusion of aluminum atoms was accelerated and the resistance of the test chip grew gradually larger, to finally become infinite, i.e., to be in an open state. We define the failure time of the test chip by the time required for increasing the resistance, e.g., twice that of the initial resistance, and the electromigration resistance service life of the metallized layer by the average failure time obtained with a number of test chips. FIG. 2 shows the relationship between the content of the selected element in an aluminum alloy containing 1.0% by weight of silicon and the electromigration resistance service life of a metallized aluminum alloy, estimated as a multiple of that of a metallized aluminum alloy not containing the selected element. Each of these curves exhibits a peak at a certain amount of the selected element, and the peak nearly corresponds to the amount of solubility of the selected element at about 500° C.

The relative service life of the chips is estimated as good when this is more than 10 times that of the standard test chip containing 1.0% by weight of silicon, but not containing the selected element. The relative service life of the test chip containing either zirconium or molybdenum exhibited a value lower than 10 times that of the standard test chip. Therefore, we deleted these two elements from the invention of this continuation in part application.

Figure 3:
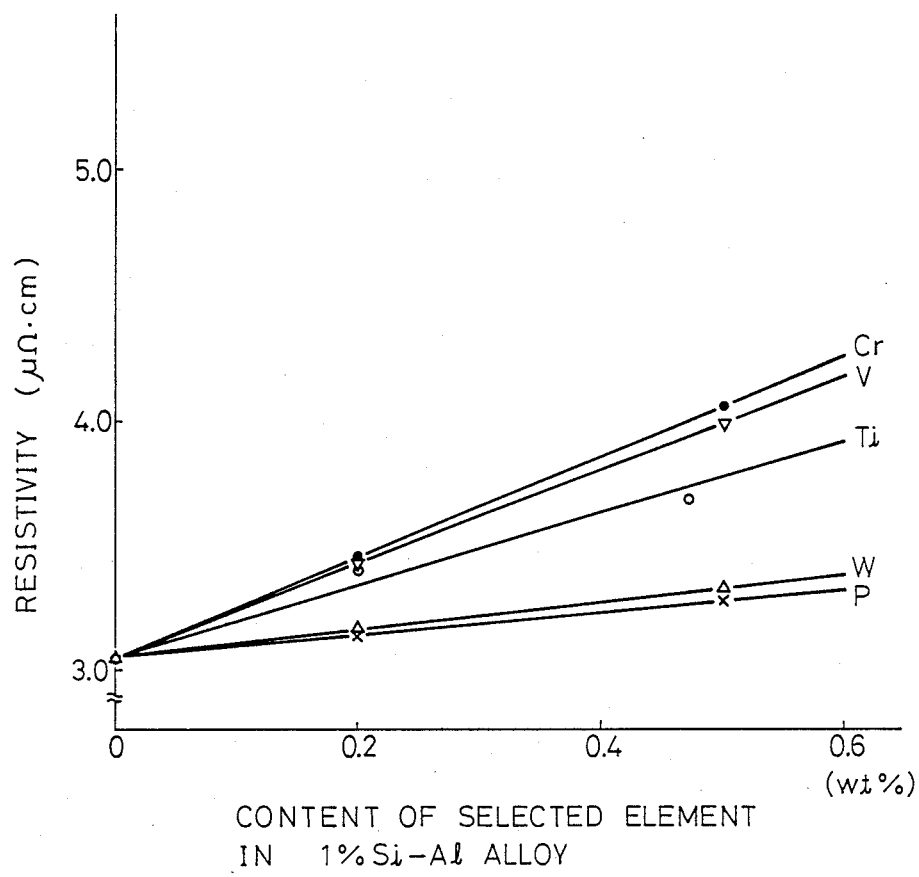
FIG. 3 is a diagram showing the relationship between the resistivity of a metallized layer and the content of a selected element.

As can be seen from FIG. 3, which shows the relationship between the electric resistivity and the content of the selected element of the metallized aluminum alloy containing 1.0% by weight of silicon, the content of less than 0.3% by weight of the selected element has little affect on the resistivity of the aluminum alloy.

I claim:

1. A semiconductor device comprising a metallized layer formed on a silicon substrate, wherein said metallized layer is an aluminum alloy consisting essentially of aluminum, silicon and at least one element selected from the group consisting of vanadium in an amount of at least 0.06% and less than 0.1% by weight, tungsten in an amount of at least 0.1% and less than 0.3% by weight, and phosphorus in an amount of at least 0.05% and less than 0.12% by weight, the amount of silicon being 1.0% to 3.0% by weight.

2. A semiconductor device according to claim 1, wherein said selected element is vanadium in an amount of at least 0.07% and less than 0.12% by weight.

3. A semiconductor device according to claim 1, wherein said selected element is tungsten in an amount of at least 0.13% and less than 0.24% by weight.

4. A semiconductor device according to claim 1, wherein said selected element is phosphorus in an amount of at least 0.06% and less than 0.10% by weight.

5. A semiconductor device comprising:
a silicon substrate; and
a metallized layer formed on said silicon substrate, wherein said metallized layer is an aluminum alloy consisting essentially of aluminum, silicon and chromium in an amount of at least 0.10% and less than 0.17% by weight, the amount of silicon being 1.0% to 3.0% by weight, the amount of chromium maximizing the relative service life of the metallized layer.

6. A semiconductor device comprising a metallized layer formed on a silicon substrate, wherein said metallized layer is an aluminum alloy consisting essentially of aluminum, 1.0% to 3.0% by weight of silicon and about 0.08% by weight of vanadium.

7. A semiconductor device comprising a metallized layer formed on a silicon substrate, wherein said metallized layer is an aluminum alloy consisting essentially of aluminum, 1.0% to 3.0% by weight of silicon and about 0.12% by weight of chromium.

8. A semiconductor device comprising a metallized layer formed on a silicon substrate, wherein said metallized layer is an aluminum alloy consisting essentially of aluminum, 1.0% to 3.0% by weight of silicon and about 0.16% by weight of tungsten.

9. A semiconductor device comprising a metallized layer formed on a silicon substrate, wherein said metallized layer is an aluminum alloy consisting essentially of aluminum, 1.0% to 3.0% by weight of silicon and about 0.07% by weight of phosphorus.

* * * * *